(12) United States Patent
Hwang et al.

(10) Patent No.: US 9,711,188 B2
(45) Date of Patent: Jul. 18, 2017

(54) VERTICAL NON-VOLATILE MEMORY DEVICE INCLUDING PLURAL WORD LINE STACKS

(71) Applicant: SAMSUNG ELECTRONICS CO., LTD., Suwon-si, Gyeonggi-do (KR)

(72) Inventors: Sung-Min Hwang, Seoul (KR); Han-Soo Kim, Suwon-si (KR); Won-Seok Cho, Suwon-si (KR); Jae-Hoon Jang, Seongnam-si (KR); Sun-Il Shim, Seoul (KR); Jae-Hun Jeong, Hwaseong-si (KR); Ki-Hyun Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/141,967

(22) Filed: Apr. 29, 2016

(65) Prior Publication Data

US 2016/0247547 A1      Aug. 25, 2016

Related U.S. Application Data

(63) Continuation of application No. 13/921,554, filed on Jun. 19, 2013, now abandoned, and a continuation of
(Continued)

(30) Foreign Application Priority Data

Jul. 22, 2009   (KR) ........................ 10-2009-0067009

(51) Int. Cl.
*H01L 27/112*   (2006.01)
*G11C 5/06*     (2006.01)
(Continued)

(52) U.S. Cl.
CPC .............. *G11C 5/06* (2013.01); *H01L 27/112* (2013.01); *H01L 27/115* (2013.01); *H01L 27/11517* (2013.01)

(58) Field of Classification Search
None
See application file for complete search history.

(56) References Cited

U.S. PATENT DOCUMENTS 7,570,511 B2     8/2009  Cho et al.
2007/0252201 A1* 11/2007  Kito .................... H01L 21/8221
                                                       257/331
(Continued)

FOREIGN PATENT DOCUMENTS

JP    2008-072051    3/2008
JP    2008-103429    5/2008
(Continued)

OTHER PUBLICATIONS

Notice of Allowance Dated Aug. 31, 2016 From Corresponding Application No. KR 09-67009.

*Primary Examiner* — Sitaramarao S Yechuri
(74) *Attorney, Agent, or Firm* — Volentine & Whitt, PLLC

(57) ABSTRACT

A vertical non-volatile memory device includes a substrate, and a first stack of word lines and a second stack of word lines extending in a first direction on the substrate and separated from each other in a second direction perpendicular to the first direction. The device further includes first array lines extending in the second direction on the first and the second stack, and connected to word lines of the first and the second stack through at least two of first via contacts in a same level. The device further include first word select lines being in a same level and extending in the first direction, and connected to each of the first array lines
(Continued)

through at least one of second via contacts. Ends of each of the first and the second stack have a form of stairs on the substrate.

16 Claims, 20 Drawing Sheets

Related U.S. Application Data application No. 12/636,912, filed on Dec. 14, 2009, now Pat. No. 8,492,831.

(51) Int. Cl.
*H01L 27/115* (2017.01)
*H01L 27/11517* (2017.01)

(56) References Cited

U.S. PATENT DOCUMENTS

| | | | |
|---|---|---|---|
| 2008/0149913 A1* | 6/2008 | Tanaka | H01L 27/2454 257/5 |
| 2008/0173932 A1* | 7/2008 | Kidoh | H01L 27/11568 257/324 |
| 2009/0230449 A1* | 9/2009 | Sakaguchi | H01L 27/0688 257/298 |
| 2009/0242968 A1* | 10/2009 | Maeda | H01L 27/11551 257/324 |
| 2009/0267128 A1* | 10/2009 | Maejima | H01L 27/11565 257/314 |
| 2010/0052042 A1* | 3/2010 | Tanaka | H01L 21/8221 257/324 |
| 2010/0213526 A1* | 8/2010 | Wada | H01L 21/76808 257/314 |
| 2010/0213537 A1* | 8/2010 | Fukuzumi | H01L 27/11578 257/326 |
| 2010/0232224 A1* | 9/2010 | Maeda | G11C 16/0483 365/185.18 |
| 2010/0327323 A1* | 12/2010 | Choi | G11C 16/0483 257/202 |
| 2011/0140070 A1 | 6/2011 | Kim | |
| 2013/0163304 A1 | 6/2013 | Kim | |

FOREIGN PATENT DOCUMENTS

| | | | |
|---|---|---|---|
| JP | WO 2009075370 A1 * | 6/2009 | G11C 16/0483 |
| KR | 100827697 B1 | 5/2008 | |
| KR | 1020080096734 A | 11/2008 | |
| WO | 2008/126774 A1 | 10/2008 | |
| WO | 2009/075370 A1 | 6/2009 | |

* cited by examiner

VERTICAL NON-VOLATILE MEMORY DEVICE INCLUDING PLURAL WORD LINE STACKS

CROSS-REFERENCE TO RELATED APPLICATIONS

This is a Continuation of application Ser. No. 13/921,554, filed Jun. 19, 2013, which is a Continuation of application Ser. No. 12/636,912, filed Dec. 14, 2009, which issued as U.S. Pat. No. 8,492,831, on Jul. 23, 2013, and which claims the benefit of Korean Patent Application No. 10-2009-0067009, filed on Jul. 22, 2009, in the Korean Intellectual Property Office.

BACKGROUND

The inventive concept relates to non-volatile memory devices and to methods of fabricating the same. More particularly, the inventive concept relates to vertical non-volatile memory devices including vertical strings of transistors and multiple layers of metal wiring, and to methods of fabricating the same.

The semiconductor industry employs a variety of techniques aimed at maximizing the integration of conventional planar non-volatile memory devices. These techniques include designing the structure of a cell transistor so that two or more pieces of data can be stored in a single cell of the device. Despite these techniques, the degree to which the integration of a conventional planar flash memory device can be increased is limited due to the fact that all of the wiring layers are located in a single plane (layer).

Therefore, vertical memory devices are being developed to provide higher degrees of integration. In a vertical memory device, a plurality of cell transistors of a chip are arrayed in a vertical direction

SUMMARY

According to an aspect of the inventive concept, there is provided a vertical non-volatile memory device including a substrate, a plurality of groups of memory cell strings on the substrate wherein each of the memory cell strings has a plurality of memory transistors distributed in a vertical direction substantially perpendicular to the plane of the substrate, integrated word lines coupled to sets of the memory transistors, respectively, and stacks of layer of word select lines on the substrate and wherein the word select lines are connected to the integrated word lines, respectively. A respective array of the memory transistors is disposed on each of several layers above the substrate. The memory transistors of each of the sets, to which a respective integrated word line is coupled, are those memory transistors which constitute a respective one of the groups of the memory cell strings and which are disposed within the same layer above the substrate.

According to another aspect of the inventive concept there is provided a vertical non-volatile memory device including a substrate, memory cell strings disposed in a matrix of n rows by m columns on a first region of the substrate, integrated word lines coupled to sets of the memory transistors, respectively, and word select lines connected to the integrated word lines, respectively. Each of the memory cell strings has a number k of memory transistors distributed in a vertical direction substantially perpendicular to the plane of the substrate. The memory transistors of the memory cell strings are disposed such that a respective array of the memory transistors is disposed on each of k numbers of layers above the substrate. The memory transistors of each of the sets, to which a respective integrated word line is coupled, is disposed in a matrix of the n rows by 'a' columns in the first region of the substrate. The word select lines include a plurality of first word select lines disposed on a second region of the substrate, and a plurality of second word select lines disposed on a third region of the substrate. Each of the first word select lines is connected to a respective one of the integrated word lines on the second region of the substrate, and the first word select lines are disposed in a matrix of k columns by j files. Each of the second word select lines is connected to a respective one of the integrated word lines on the third region of the substrate, and the second word select lines are also disposed in a matrix of k columns by j files. With respect to the "rows", "columns" and "files", the rows each extend in a direction substantially parallel to the plane of the substrate, the columns each extend in another direction substantially parallel to the plane of the substrate, and the files are the number of layers stacked in the vertical direction substantially perpendicular to the plane of the substrate. Also, the second region of the substrate extends from one side of the first region in a direction parallel to the columns, and the third region of the substrate extends from the other side of the first region in a direction parallel to the columns such that the second and third regions are symmetrical about the first region. Furthermore, n, m, k, and j denote natural numbers equal to or greater than 2, respectively, 'a' denotes a natural number, j is smaller than k, and 'a' is smaller than each of k and m

BRIEF DESCRIPTION OF THE DRAWINGS

The inventive concept will be more clearly understood from the following detailed description of preferred embodiments thereof taken in conjunction with the accompanying drawings in which.

DETAILED DESCRIPTION OF THE PREFERRED EMBODIMENTS

Figure 1:
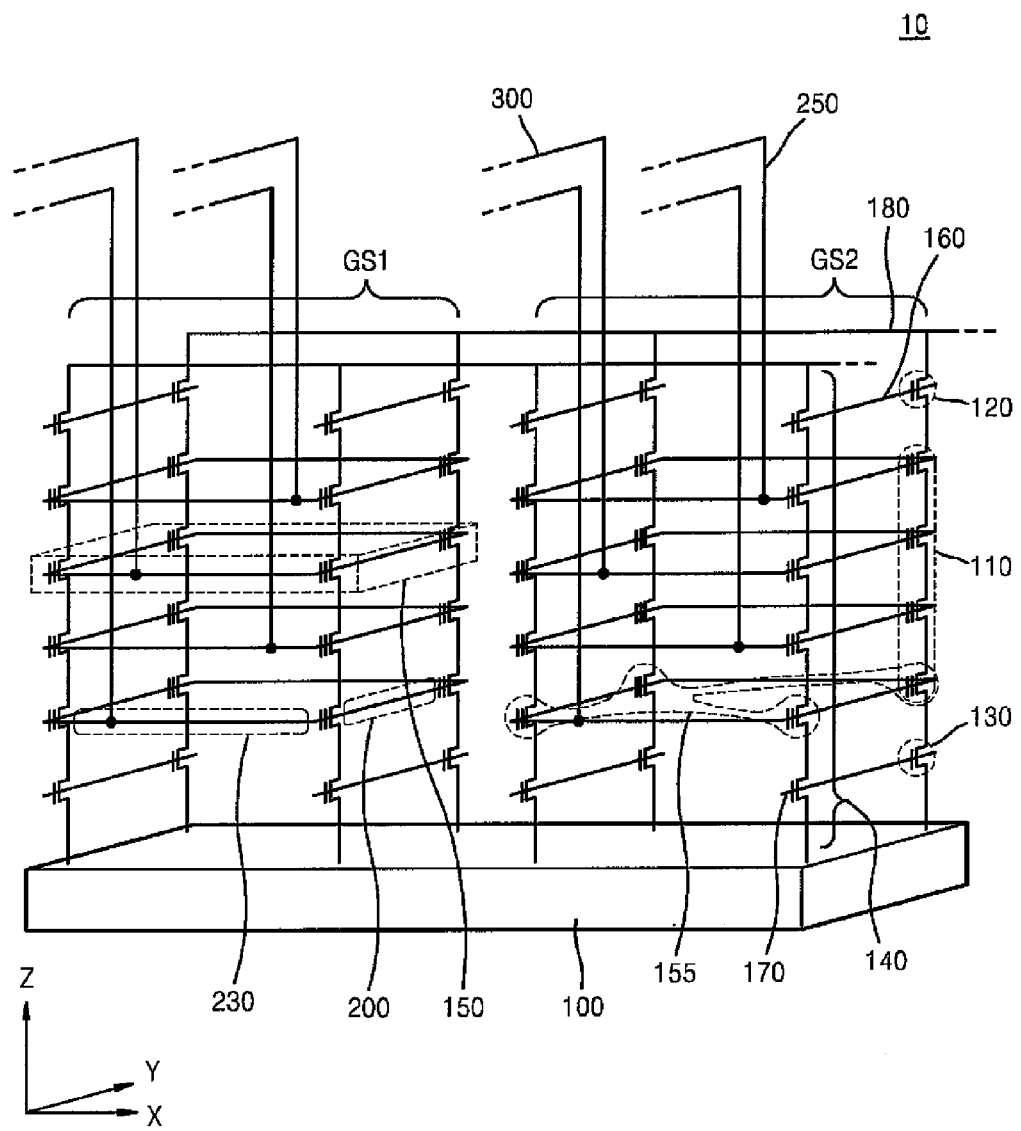
FIG. 1 is a schematic wiring diagram of an embodiment of a vertical non-volatile memory device according to the inventive concept.

Embodiments of the inventive concept will now be described more fully with reference to the accompanying drawings. Like reference numerals are used to denote like elements throughout. Moreover, the sizes, lengths and shapes of elements, etc. may be exaggerated in the drawings for clarity. Thus, the sizes, lengths and shapes of elements, etc. in actual embodiments of the inventive concept may deviate from those shown in the drawings due, for example, to manufacturing techniques and tolerances. In addition, although all of the elements of every embodiment of a vertical non-volatile memory device disclosed herein may not be shown in any one particular drawing, like elements may be found in drawings illustrating other embodiments and therefore, reference may be made to those drawings to gain a complete understanding of each and every embodiment disclosed herein.

Also, throughout the specification, the description of features being "arrayed" in a particular direction is used to refer to the number of rows, columns or layers (files) in the array of that feature. Thus, for example, when the specification describes that k (e.g., k=4) lines are arrayed in a Z-axis direction, such a description refers to the fact that there are k (four, for example) files of lines in the Z-axis direction. Furthermore, the term stack may be used to refer to a collection of elements, e.g., integrated word lines, in which at least substantial portions of the elements are stacked one atop the other.

A first embodiment of a vertical non-volatile memory device according to the inventive concept will now be described with reference to FIGS. 1-3.

Referring first to FIG. 1, the vertical non-volatile memory device 10 includes a substrate 100, a plurality of memory cell strings 140, a plurality of integrated word lines 150, a plurality of bit lines 180, a plurality of first connect contacts 250, and a plurality of word select lines 300.

The memory cell strings 140 are arrayed in a horizontal matrix of n rows by m columns (e.g., 2 rows×4 columns) and each string 140 extends vertically in a direction Z (hereinafter, referred to as the "Z-axis" direction) on the substrate 100. Note, the spatially relative term "vertical" or "vertically" is used herein to refer to a direction that is generally perpendicular to the plane of the substrate 100, whereas the term "horizontal" or "horizontally" is used to refer to a direction that is generally parallel to the plane of the substrate 100.

The memory cell strings 140 may respectively include k (e.g., k=4) memory transistors 110, a drain select transistor 120, and a source select transistor 130. For example, the memory cell strings 140 may include memory transistors 110 having a vertical NAND structure. The memory cell strings 140 disposed along a respective row (hereinafter referred to as the "X-axis" direction) are connected to each other through a respective bit line 180. Also, the memory cell strings 140 in each row may be divided into groups, for example, first and second memory cell string groups GS1 and GS2. Thus, the first and second memory cell string groups GS1 and GS2 are ordered in the X-axis direction.

The integrated word lines 150 are respectively disposed on a number k (e.g., k=4) of layers in which the memory transistors 110 in the memory cell strings 140 are disposed. With respect to the integrated word lines 150, i (e.g., i=2) integrated word lines 150 are arrayed in the X-axis direction in each layer, and k (e.g., k=4) integrated word lines 150 are arrayed in the Z-axis direction. More specifically, stacks of integrated word lines 150 corresponding in number to the number of cell string groups (e.g., 2) are disposed on the substrate 100, and a respective integrated word line 150 is coupled to the set 155 of memory transistors 110 which are disposed in the same layer and make up a respective one of the memory cell string groups GS1 or GS2. That is, each of the integrated word lines 150 is coupled to all (the set) of the memory transistors 155 in a particular layer which are part of either the first memory cell string group GS1 or the second memory cell string group GS2. Also, the memory transistors 110 of each set 155 are arrayed a matrix of n rows by a columns (e.g., 2 rows×2 columns). Thus, in this particular example, each integrated word line 150 is coupled to four respective memory transistors 110. Furthermore, the integrated word lines 150 include word lines 200 which each extend between memory transistors 110 in a Y-axis direction (a horizontal direction at an angle, e.g., a right angle, to the X-axis direction), and array lines 230 which each extend between memory transistors 110 in the X-axis direction. Thus, in addition, for each array of memory transistors 110 on a respective layer above the substrate 100, there are a plurality of integrated word lines 150 (e.g., 2) electrically isolated from each other in the layer and connected to sets (e.g., 4 each) of the memory transistors 110, respectively.

Each word select line 300 is connected to the integrated word line 150 coupled to a respective set 155 of the memory transistors 110. In particular, the word select lines 300 and respective ones of the integrated word lines 150 are connected to each other by the first connect contacts 250, respectively. The first connect contacts 250 may be via plugs, redistribution lines (RDLs), or the like. With further respect to the word select lines 300, k (e.g., k=4) word select lines 300 are arrayed in the X-axis direction, and i (e.g., i=2) word select lines 300 are arrayed in the Z-axis direction. That is, i (e.g., i=2) layers each of which has a plurality k (e.g., k=4) of coplanar word select lines 300 are disposed on the substrate 100.

Figure 2:
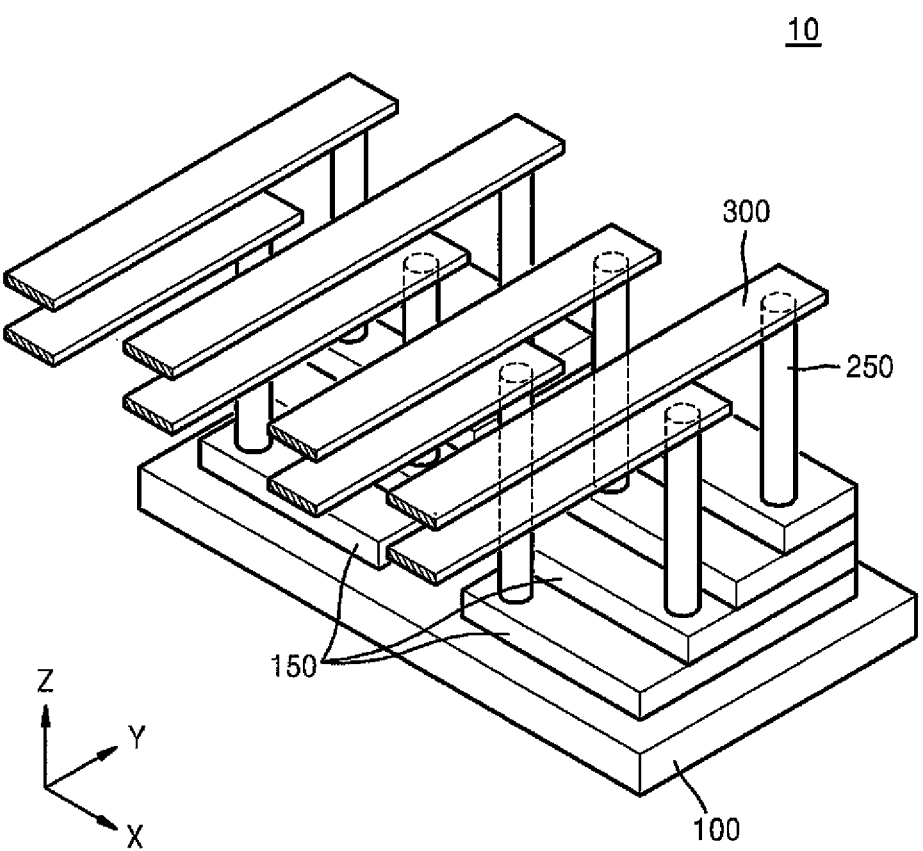
FIG. 2 is a schematic perspective view of the embodiment of a vertical non-volatile memory device illustrated in FIG. 1.
Figure 3:
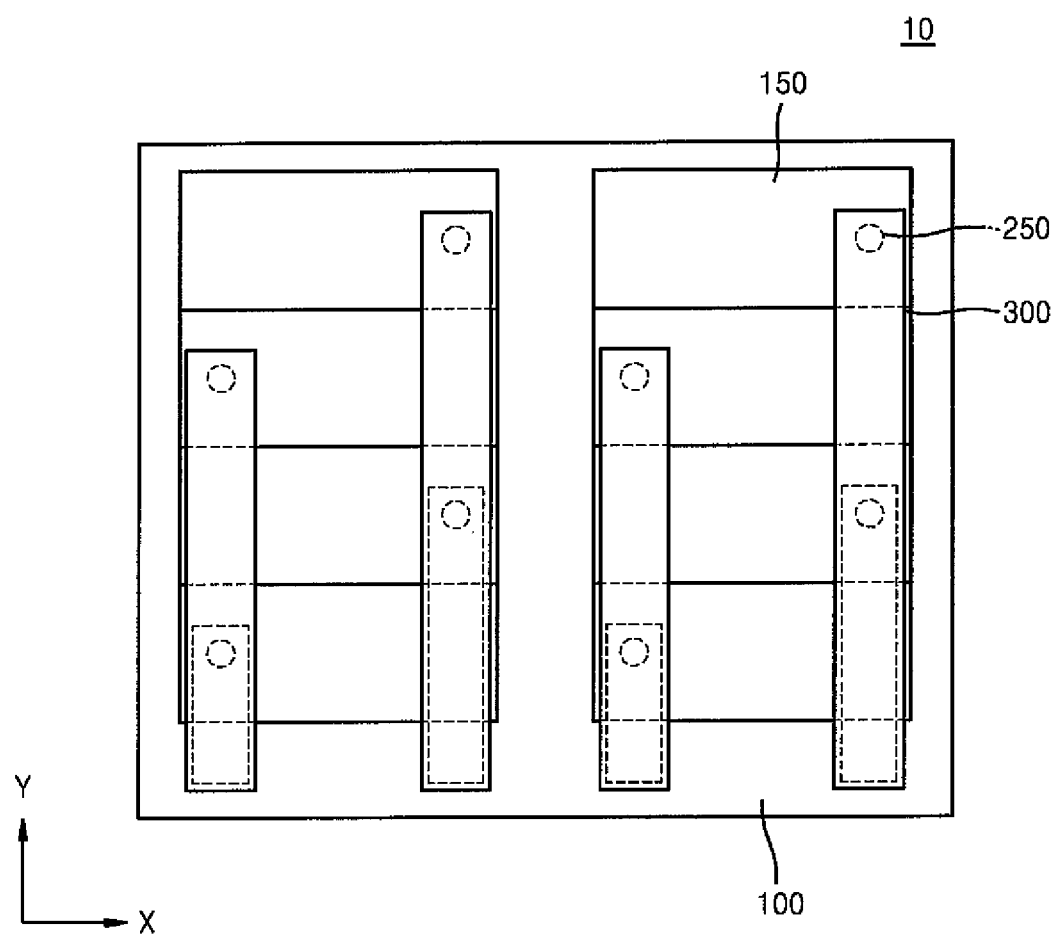
FIG. 3 is schematic plan view of the embodiment of a vertical non-volatile memory device illustrated in FIG. 1.

FIGS. 2 and 3 show this example in which the integrated word lines 150 are arranged in a 2×4 matrix in the X-axis direction and the Z-axis direction on the substrate 100. Although not shown, insulation is disposed between the integrated word lines 150 to prevent the integrated word lines 150 from being electrically conductively connected to each other, i.e., so as to electrically isolate the integrated word lines 150 from one another. In particular, interlayer insulation layers may be disposed on the substrate between the layers, respectively.

As mentioned above, the integrated word lines 150 are connected to the word select lines 300 through the first connect contacts 250. In this respect, the integrated word lines 150 may have the form of a set of stairs (in the Z-axis direction) in order to facilitate their electrical connection to the word select lines 300. In this case, the first connect contacts 250 may be via plugs.

FIGS. 2 and 3 thus show the one-to-one connection between the word select lines 300 and the integrated word lines 150 and the stacking of the word select lines 300 in the Z-axis direction according to an aspect of the inventive concept. As a result, in this example, each of the word select lines 300 is connected to 2 word lines 200 (FIG. 1) to which a program voltage is applied and thus, the number of programs (NOP) is also 2. Therefore, the number of programs (NOP) is less than would be the case if the word select lines 300 having the same pitch were disposed on a single layer. In that case, only four of the word select lines 300 could be arranged in the X-axis direction, each of the word select lines 300 would be connected to four word lines 200, and the NOP would thus be 4. Accordingly, the arrangement of the word select lines 300 according to the inventive concept allows the NOP to be minimized so that a highly reliable vertical non-volatile memory device is obtained.

Figure 4:
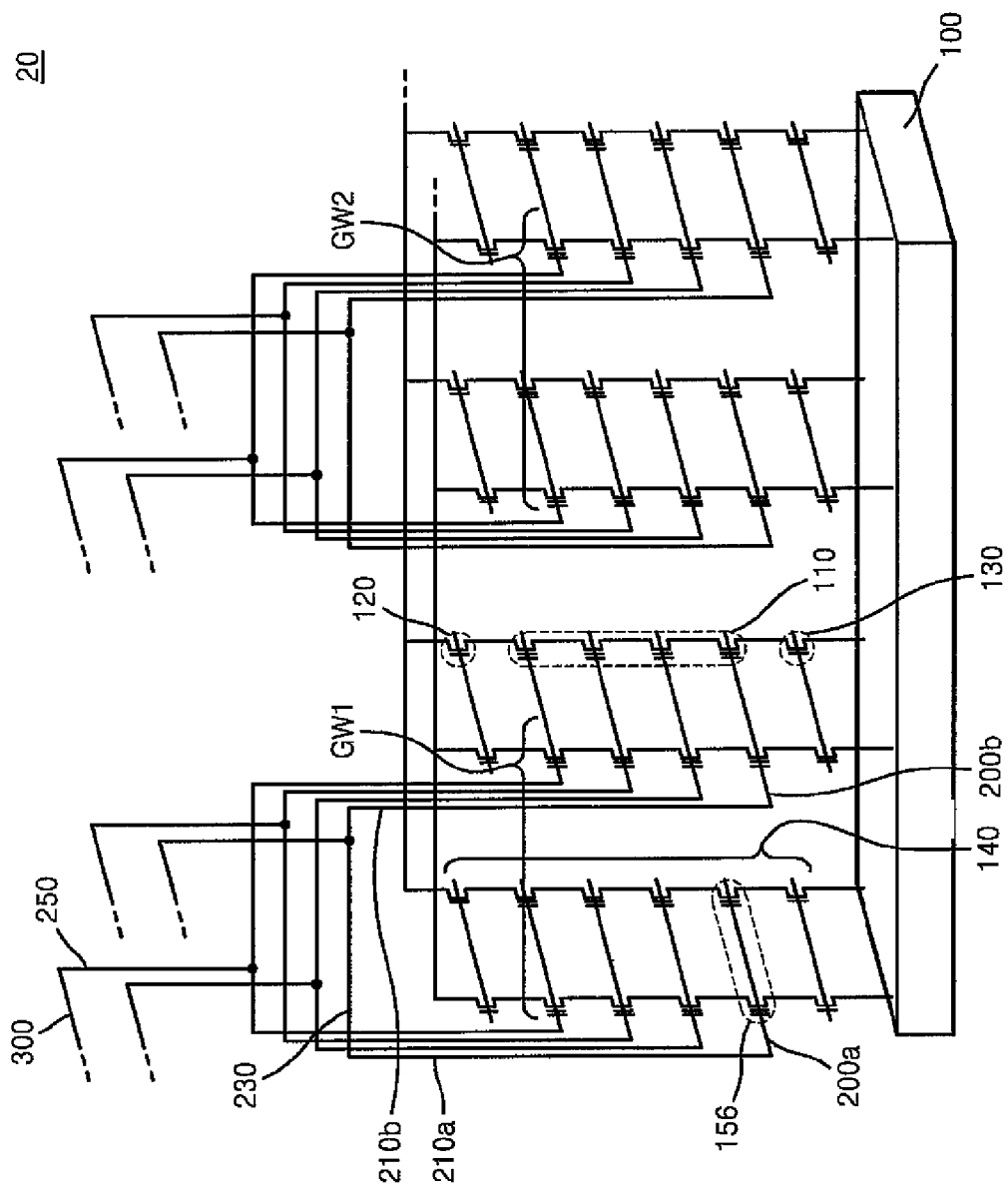
FIG. 4 is a schematic wiring diagram of another embodiment of a vertical non-volatile memory device according to the inventive concept.

FIG. 4 illustrates the layout of another embodiment of a vertical non-volatile memory device according to the inventive concept. Referring to FIG. 4, the vertical non-volatile memory device 20 includes a substrate 100, memory cell strings 140, respective word lines 200a and 200b, second connect contacts 210a and 210b, array lines 230, first connect contacts 250, and word select lines 300. The memory cell strings 140 include an array of memory transistors 156 in each layer. For example, a 4×2 array of the memory transistors is provided in the X-axis and Y-axis directions. The first and second connect contacts 210, 210b and 250 may be via plugs, RDLs, or the like.

With respect to the word lines 200a and 200b, m (e.g., m=4) word lines 200a and 200b are arrayed in the X-axis direction, and k (e.g., k=4) word lines 200a and 200b are arrayed in the Z-axis direction. Also, the word lines 200a and 200b are respectively coupled to n (e.g., n=2) memory transistors 156 arrayed in the Y-axis direction. More specifically, each of the word lines 200a and 200b is coupled to the respective memory transistors 156 disposed in the same column within a layer. The word lines 200a and 200b are also divided into i (e.g., i=2) groups in the X-axis direction. In this example, therefore, the word lines 200a and 200b are divided into first and second word line groups GW1 and GW2 in the X-axis direction.

With respect to the array lines 230, i (e.g., i=2) array lines 230 are arrayed in the X-axis direction, and k (e.g., k=4) array lines 230 are arrayed in the Y-axis direction. The array lines 230 are respectively connected to a number a (e.g., a=2) of the respective word lines 200a and 200b arrayed in the X-axis direction within the same layer. The array lines 230 and the respective word lines 200a and 200b are connected to each other via the second connect contacts 210a and 210b. Also, in this example, each array line 230 is respectively connected to the respective word lines 200a and 200b which are in the same respective word line group GW1 or GW2.

With respect to the word select lines 300, k (e.g., k=4) word select lines 300 are arrayed in the X-axis direction, and i (e.g., i=2) word select lines 300 are arrayed in the Z-axis direction. The word select lines 300 are connected to the array lines 230, respectively. The word select lines 300 and the array lines 230 may be connected to each other via the first connect contacts 250.

Reference will now be made to the schematic perspective and plan views of FIGS. 5 through 7.

Figure 5:
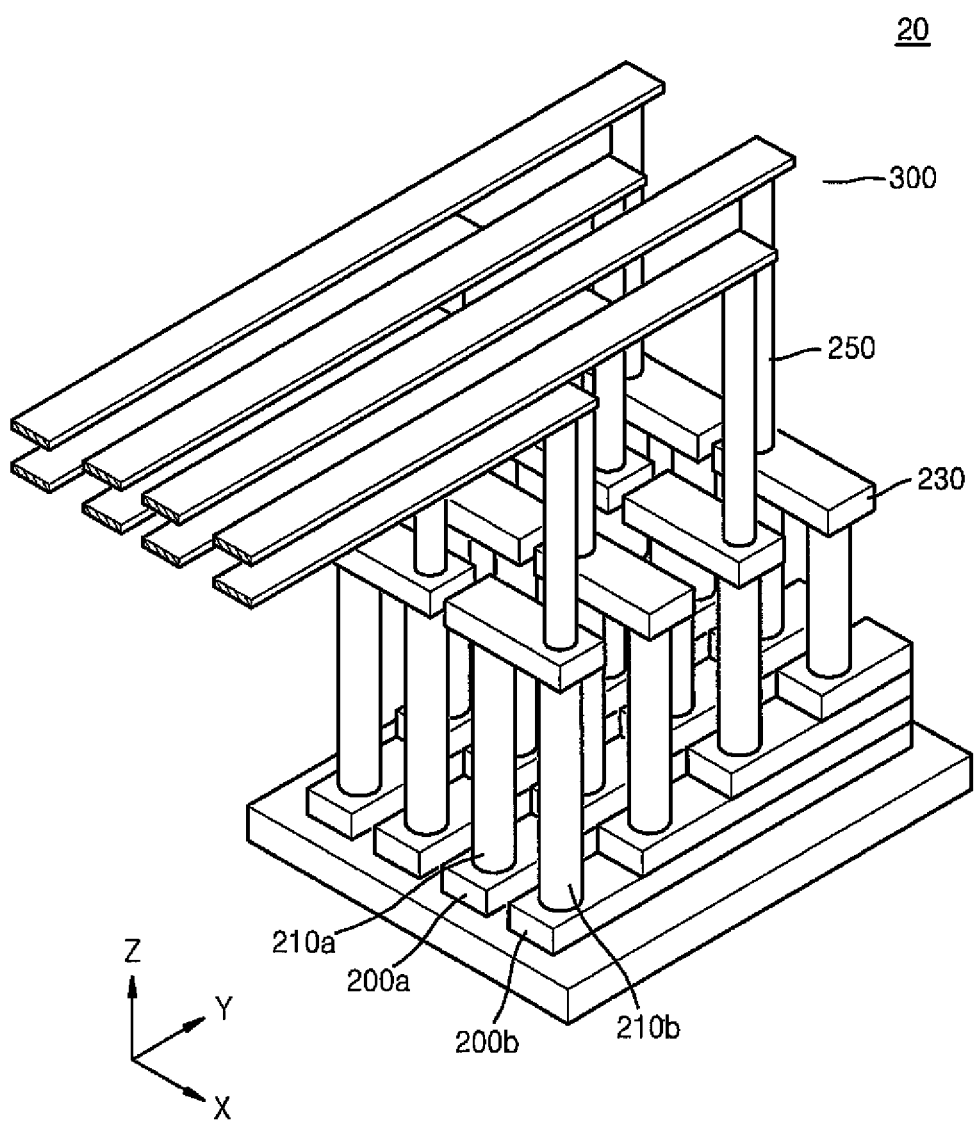
FIG. 5 is a schematic perspective view of the embodiment of a vertical non-volatile memory device illustrated in FIG. 4.
Figure 6:
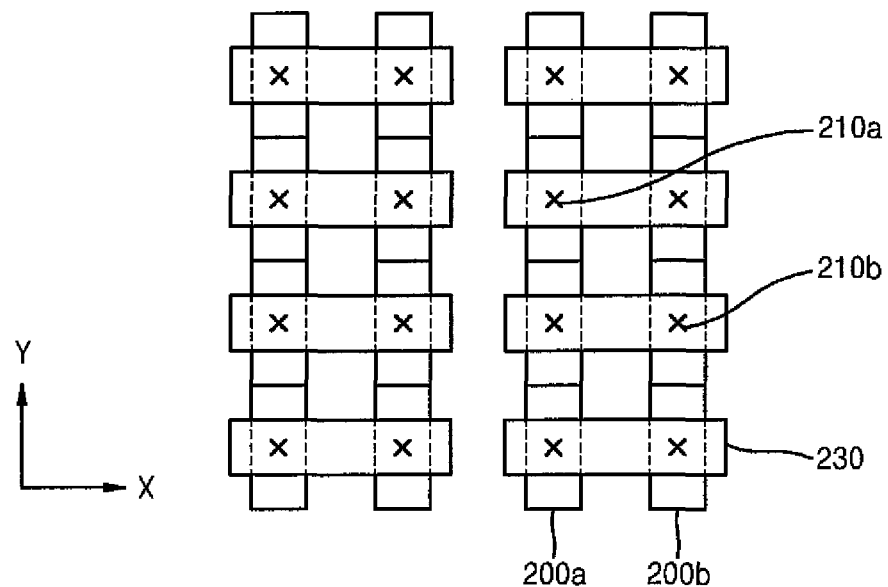
FIG. 6 is a schematic plan view of one layer of the embodiment of a vertical non-volatile memory device illustrated in FIG. 4.
Figure 7:
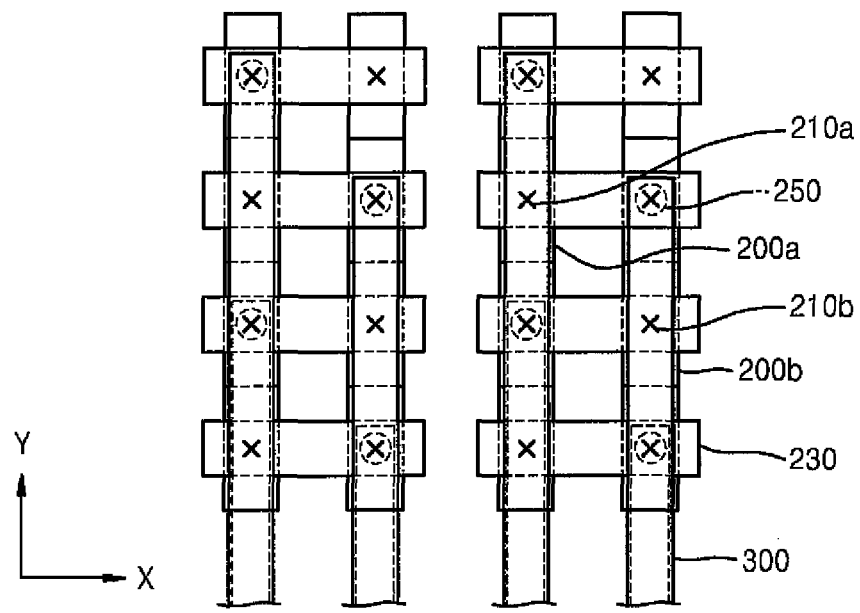
FIG. 7 is schematic plan view of the embodiment of the vertical non-volatile memory device illustrated in FIG. 4.

FIGS. 5 through 7 show how the respective word lines 200a and 200b of the vertical non-volatile memory device 20 are arrayed in a 4×4 matrix in the X-axis and Z-axis directions on the substrate 100. Although not shown, insulation is disposed between the respective word lines 200a and 200b in order to prevent the respective word lines 200a and 200b from being electrically conductively coupled to each other. FIG. 5 also shows how each integrated word line is made up of a respective pair of word lines 200a, 200b, an array line 230, and second connect contacts 210a, 210b connecting the array line 230 to the word lines 210a, 210b, respectively. In this example, as well, with the word lines 200a and 200b arrayed as they are in the Z-axis direction, and the array lines 230 arrayed as they are in the X-axis direction, it can be considered that two stacks of integrated word lines are disposed on the substrate.

Each of the array lines 230 is respectively connected to some of the respective word lines 200a and 200b. Also, the respective word lines 200a and 200b are stacked in the form of stairs in order to facilitate the electrical connection between the array lines 230 and the word lines 200a and 200b. In this case, the second connect contacts 210a and 210b may be via plugs.

Figure 8:
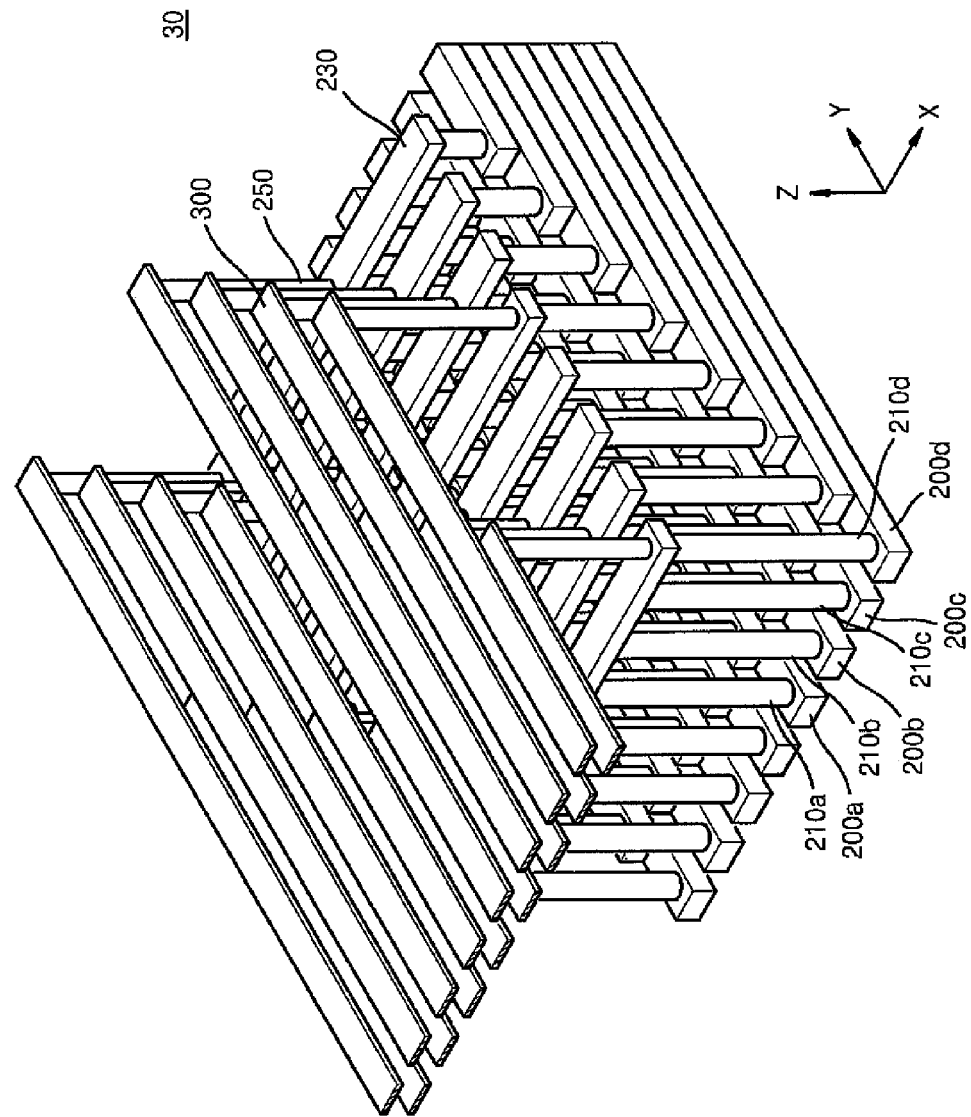
FIG. 8 is a schematic perspective view of another embodiment of a vertical non-volatile memory device according to the inventive concept.
Figure 9:
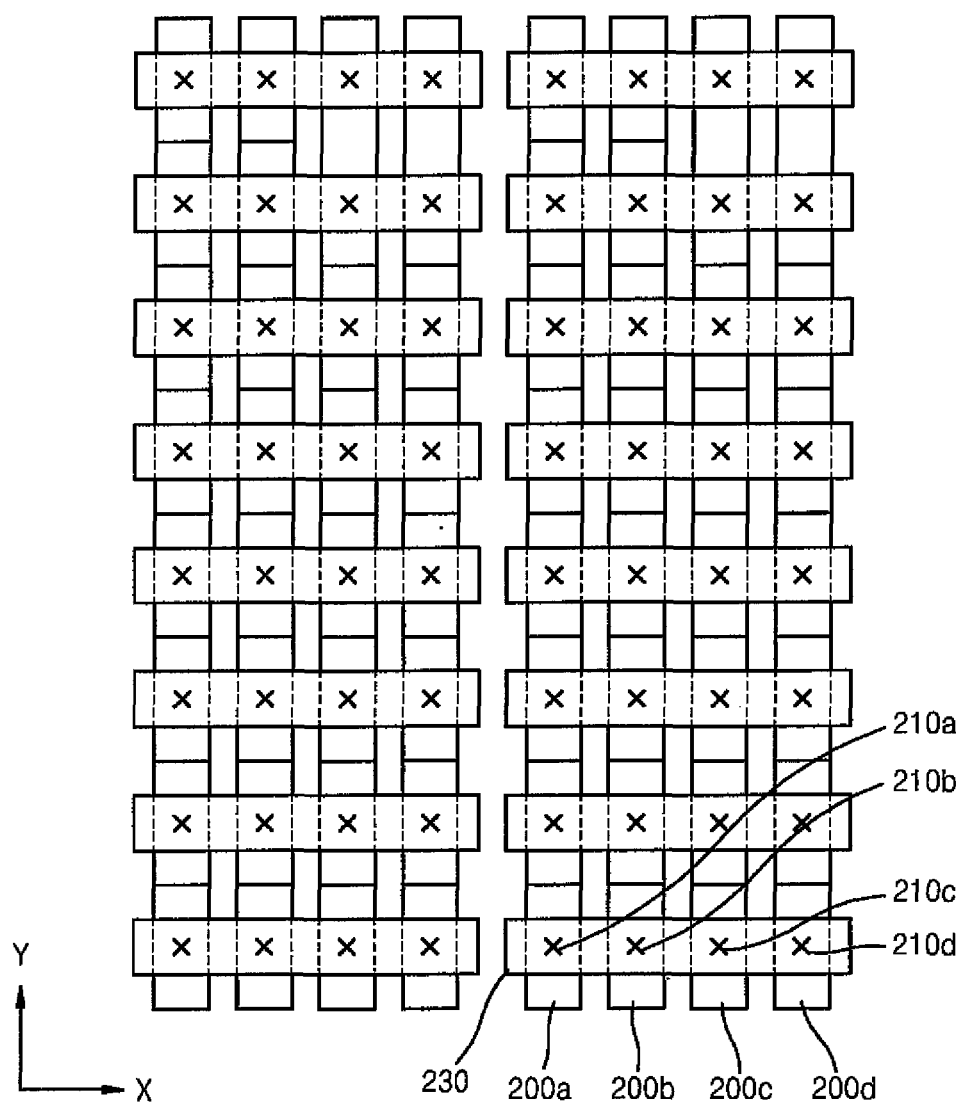
FIG. 9 is a schematic plan view of one layer of the embodiment of a vertical non-volatile memory device illustrated in FIG. 8.
Figure 10:
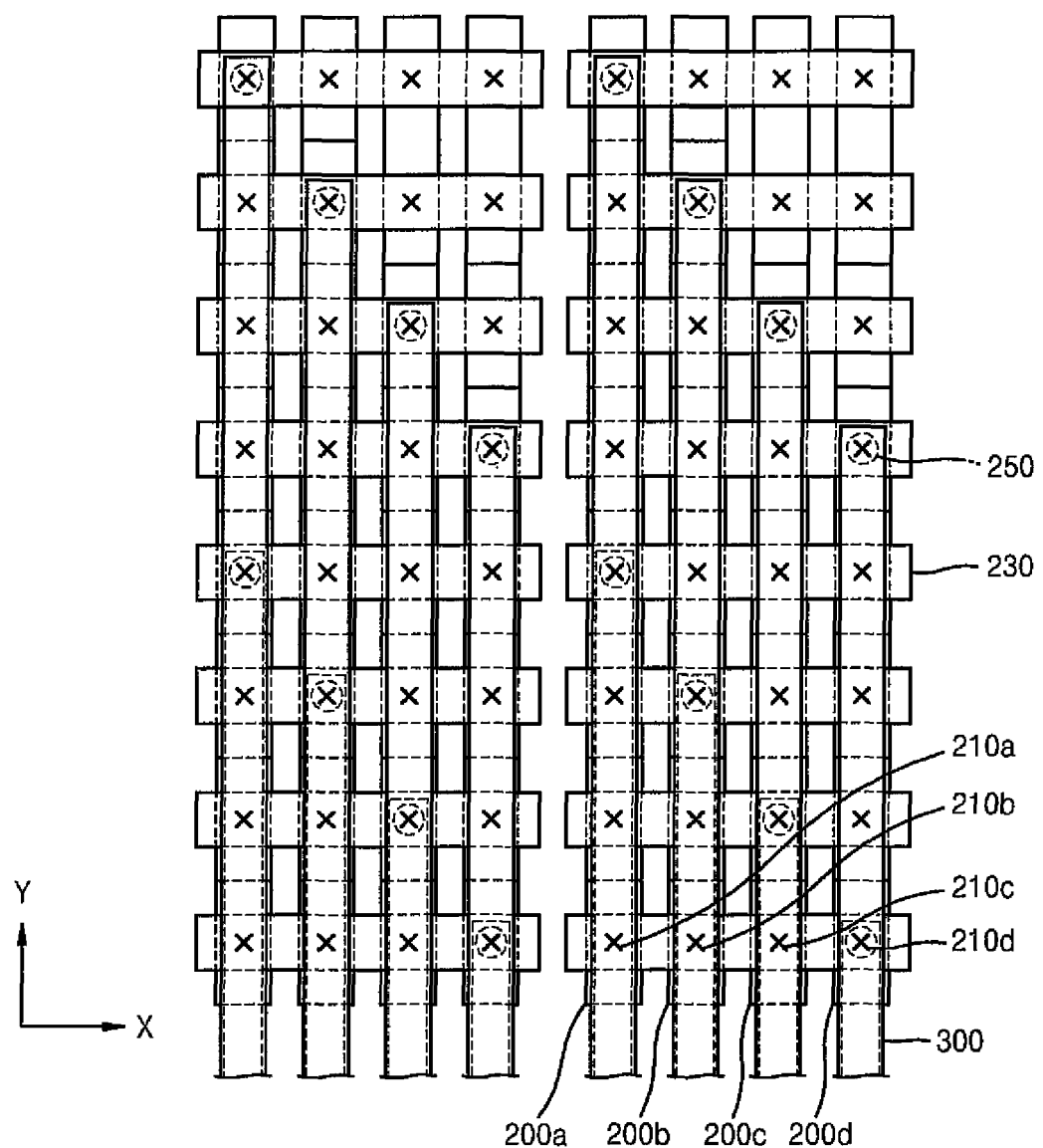
FIG. 10 is a schematic plan view of the vertical non-volatile memory device the embodiment of the vertical non-volatile memory device illustrated in FIG. 8.

Another embodiment of a vertical non-volatile memory device according to the inventive concept will be described with reference to FIGS. 8 through 10.

The vertical non-volatile memory device 30 includes a substrate 100, a plurality of memory cell strings (not shown) on the substrate 100, respective word lines 200a, 200b, 200c, and 200d, second connect contacts 210a, 210b, 201c, and 210d, array lines 230, first connect contacts 250, and word select lines 300.

The memory cell strings are arrayed in a matrix of n rows by m columns (e.g., m=8) and each memory cell string extends in the Z-axis direction (i.e., has a number of memory transistors arrayed in the Z-axis direction). The memory cell strings may respectively include k (e.g., k=8) memory transistors (not shown), a drain select transistor (not shown), and a source select transistor (not shown). The memory cell strings of each set thereof arrayed in the X-axis direction are connected to each other by a respective bit line (not shown).

With respect to the word lines 200a, 200b, 200c, and 200d, m (e.g., m=8) respective word lines 200a, 200b, 200c, and 200d are arrayed in the X-axis direction, and k (e.g., k=8) respective word lines 200a, 200b, 200c, and 200d are arrayed in the Z-axis direction. The word lines 200a, 200b, 200c, and 200d are disposed in i (e.g., i=2) groups in each of the k (e.g., k=8) layers. Also, each of the word lines 200a, 200b, 200c, and 200d is connected to n memory transistors (not shown) arrayed in the Y-axis direction.

With respect to the array lines 230, i (e.g., i=2) array lines 230 are arrayed in the X-axis direction, and k (e.g., k=8) array lines 230 are arrayed in the Y-axis direction. The array lines 230 are respectively coupled to the groups of respective word lines 200a, 200b, 200c, and 200d, and each array line 230 is respectively connected to those word lines 200a, 200b, 200c, and 200d arrayed in the group in the X-axis direction. Thus, each of the array lines 230 is connected to a number a (e.g., a=4) of word lines. The array lines 230 and the respective word lines 200a, 200b, 200c, and 200d are connected to each other by the second connect contacts

210a, 210b, 201c, and 210d. The second connect contacts 210a, 210b, 201c, and 210d may be via plugs, RDLs, or the like.

With respect to the word select lines 300, k (e.g., k=8) word select lines 300 are arrayed in the X-axis direction, and i (e.g., i=2) word select lines 300 are arrayed in the Z-axis direction. The word select lines 300 are respectively coupled to the array lines 230. In this respect, the word select lines 300 and the array lines 230 are connected to each other by the first connect contacts 250. The first contacts 250 may be via plugs, RDLs, or the like.

Figure 11:
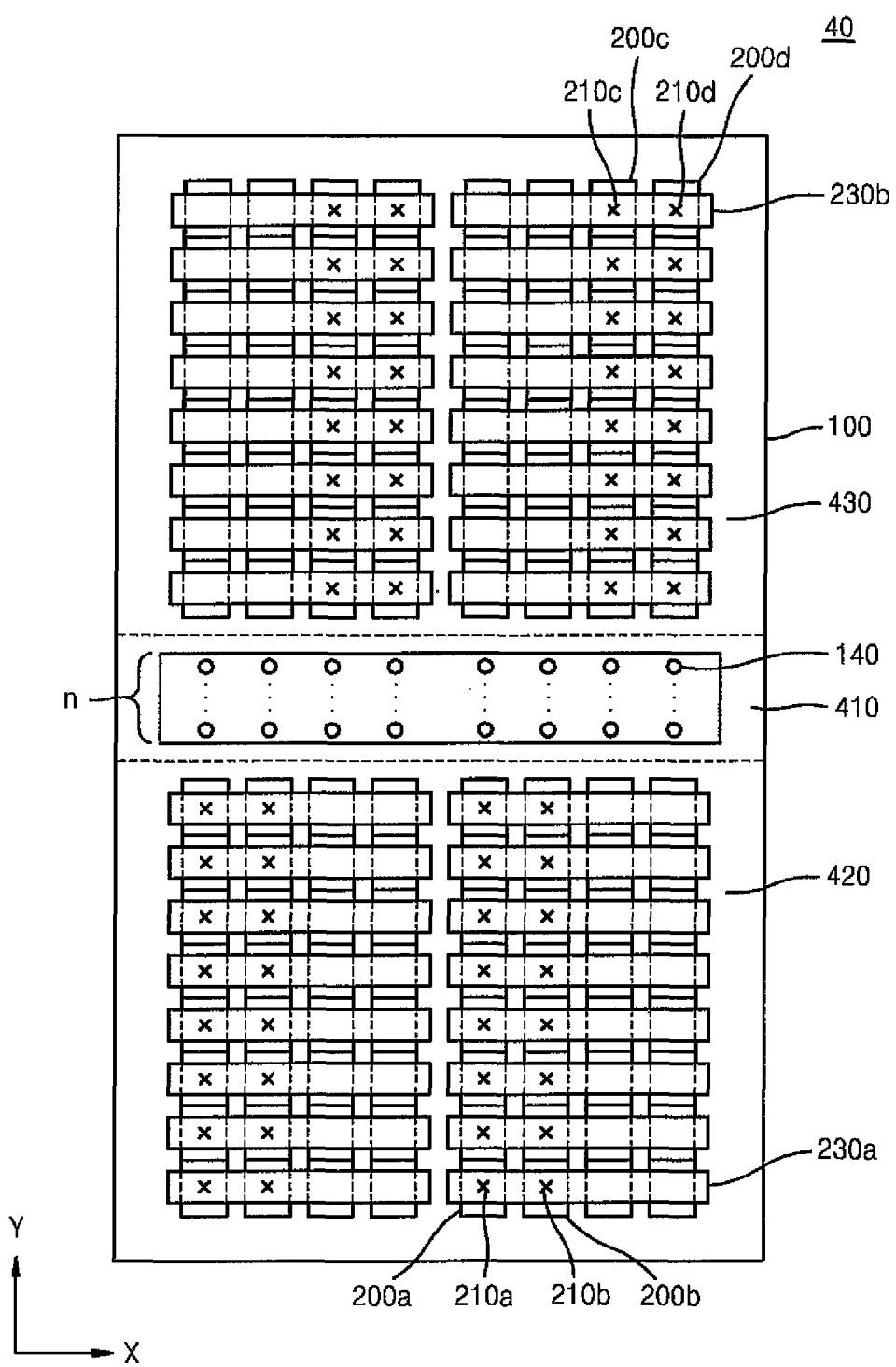
FIGS. 11 and 12 are schematic plan views of a vertical non-volatile memory device according to other embodiments of the inventive concept.
Figure 12:
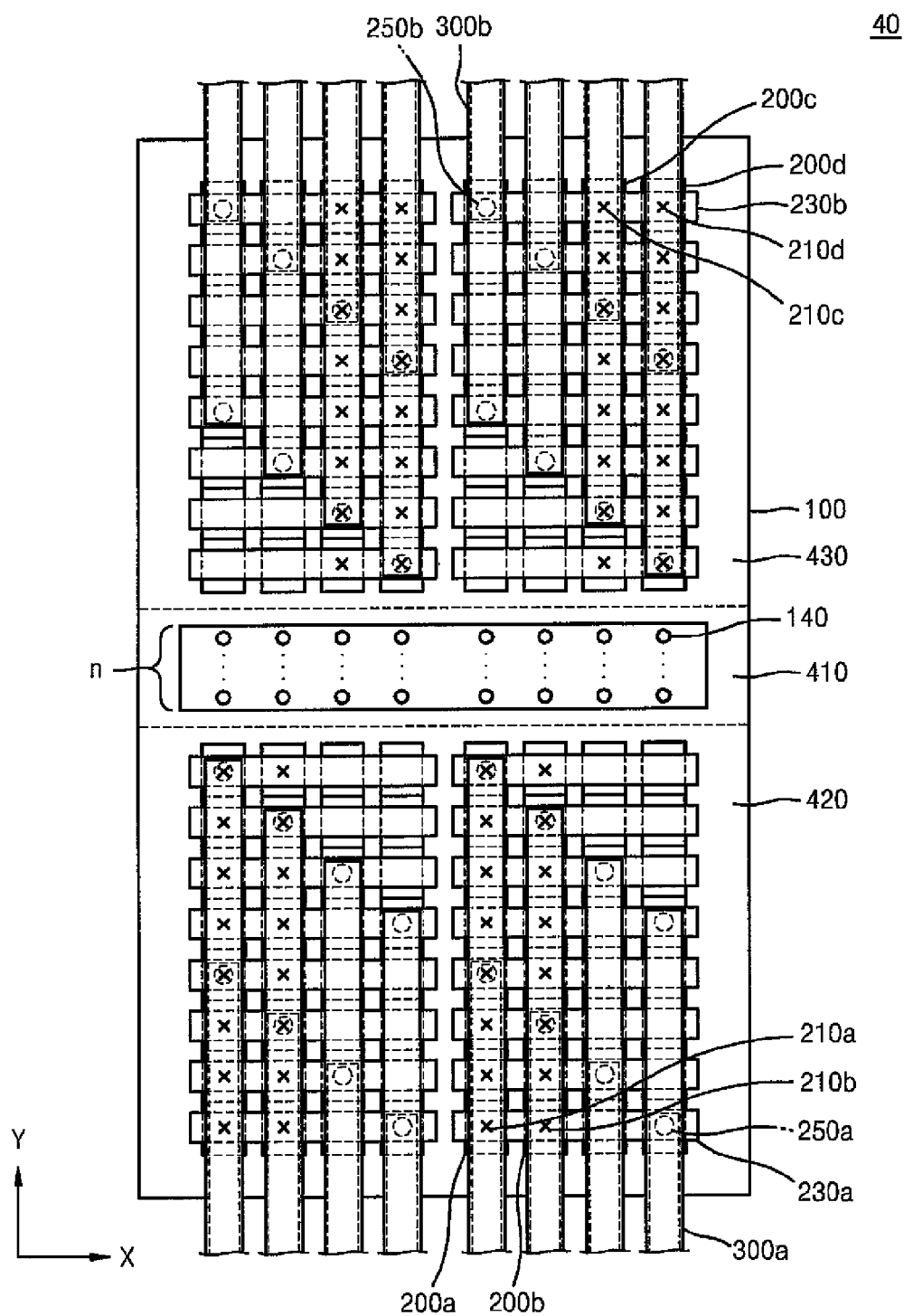

FIGS. 11 and 12 illustrate another embodiment of a vertical non-volatile memory device 40 according to the inventive concept.

The vertical non-volatile memory device 40 includes a substrate 100 having first 410, second 420 and third 430 regions, memory cell strings 140, word lines 200a, 200b, 200c, and 200d, second connect contacts 210a, 210b, 201c, and 210d, a plurality of first array lines 230a, a plurality of second array lines 230b, a plurality of first word select lines 300a, and a plurality of second word select lines 300b.

The memory cell strings 140 are arrayed in a matrix of n rows by m columns (e.g., m=8) on the first region 410 of the substrate 100, and each of the memory cell strings 140 extends in the Z-axis direction on the substrate 100. The memory cell strings 140 may respectively include k (e.g., k=8) memory transistors (not shown), a drain select transistor (not shown), and a source select transistor (not shown). The memory cell strings 140 of each set thereof distributed in the X-axis direction are connected to each other by a respective bit line (not shown).

With respect to the respective word lines 200a, 200b, 200c, and 200d, m (e.g., m=8) respective word lines 200a, 200b, 200c, and 200d are arrayed in the X-axis direction, and k (e.g., k=8) respective word lines 200a, 200b, 200c, and 200d are arrayed in the Z-axis direction. Each of the word lines 200a, 200b, 200c, and 200d extends over the first through third regions 410 through 430 of the substrate 100 in the Y-axis direction. Also, each of the word lines 200a, 200b, 200c, and 200d is coupled to n memory transistors (not shown) distributed in the Y-axis direction within a respective one of the k (e.g., k=8) layers.

With respect to the first array lines 230a disposed in the second region 420, j (e.g., j=2) first array lines 230a are arrayed in the X-axis direction, and k (e.g., k=8) first array lines 230a are arrayed in the Y-axis direction. The first array lines 230a are respectively coupled to a number a (e.g., a=2) of the respective word lines, namely, word lines 200a and 200b, that are adjacent one another in the X-axis direction.

With respect to the second array lines 230b disposed in the third region 430, j (e.g., j=2) second array lines 230b are arrayed in the X-axis direction, and k (e.g., k=8) second array lines 230b are arrayed in the Y-axis direction. The second array lines 230b are respectively coupled to a number a (e.g., a=2) of the respective word lines, namely, word lines 200c and 200d, that are adjacent one another in the X-axis direction but which are offset in the X-axis direction from the word lines 200a and 200b connected by the first array lines 230a on the second region 420 of the substrate 100.

The first and second array lines 230a and 230b and the respective word lines 200a, 200b, 200c, and 200d are connected to each other by the second connect contacts 210a, 210b, 210c, and 210d. The second contacts 210a, 210b, 210c and 210d may be via plugs, RDLs, or the like. In this respect, the k (e.g., k=8) word lines 200a, 200b, 200c, or 200d may have the form of stairs (with steps extending from the first region 410 towards each of the second and third regions 420 and 430) to facilitate their electrical connection with array lines 230a and 230b.

With respect to the first word select lines 300a, k (e.g., k=8) first word select lines 300a are arrayed in the X-axis direction, and j (e.g., j=2) first word select lines 300a are arrayed in the Z-axis direction. The first word select lines 300a are respectively coupled to the first array lines 230a.

With respect to the second word select lines 300b, k (e.g., k=8) second word select lines 300b are arrayed in the X-axis direction, and j (e.g., j=2) second word select lines 300b are arrayed in the Z-axis direction. The second word select lines 300b are respectively coupled to the second array lines 230b.

The first and second word select lines 300a and 300b and the first and second array lines 230a and 230b are connected to each other by the first connect contacts 250a and 250b. The first contacts 250a and 250b may be via plugs, RDLs, or the like.

Figure 13:
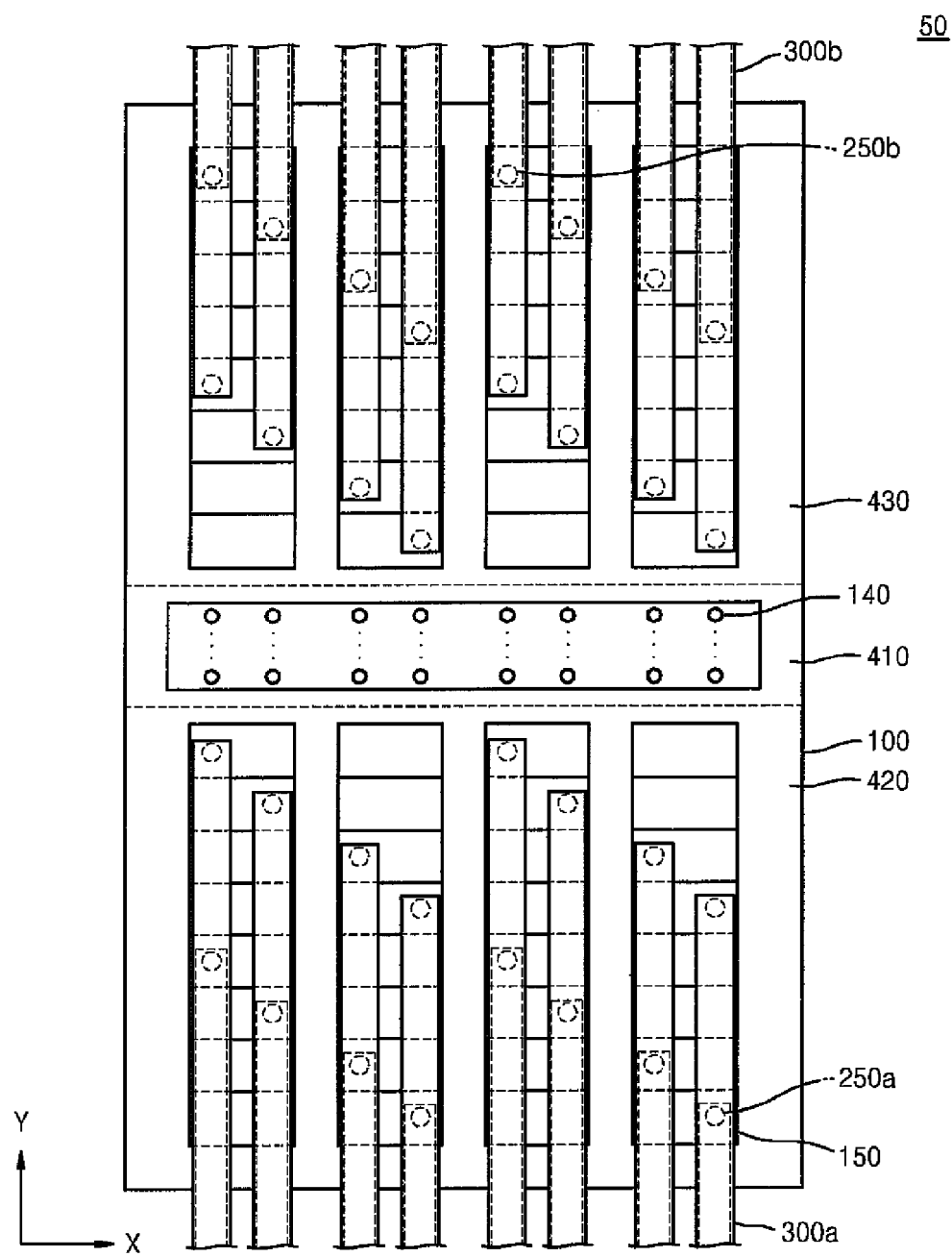
FIG. 13 is a schematic plan view of a vertical non-volatile memory device according to another embodiment of the inventive concept.

FIG. 13 shows another embodiment of a vertical non-volatile memory device 50 according to the inventive concept. This embodiment is similar to the embodiment of the vertical non-volatile memory device 40 shown in FIGS. 11 and 12 except that a plurality of integrated word lines 150 replace the word lines 200a, 200b, 200c and 200d, the second connect contacts 210a, 210b, 210c and 210d, and the first and second array lines 230a and 230b. Thus, the descriptions of features/aspects of the vertical non-volatile memory device 50 which are similar to those of the vertical non-volatile memory device 40 will not be repeated here.

With respect to the integrated word lines 150, 2*j (e.g., 2*j=4) integrated word lines 150 are arrayed in the X-axis direction, and k (e.g., k=8) integrated word lines 150 are arrayed in the Z-axis direction. The integrated word lines 150 each extend on the first through third regions 410 through 430 of the substrate 100 in the Y-axis direction. Also, the integrated word lines 150 are respectively disposed on a number k (e.g., k=8) of layers in which memory cells (not shown) of the memory cell strings 140 are disposed. Each of the integrated word lines 150 is respectively coupled to a set of memory transistors (not shown) arrayed in a matrix of n rows by a columns (e.g., a=2) in the same layer on the substrate 100. Although not shown, interlayer insulation is disposed between the integrated word lines 150 in order to prevent the integrated word lines 150 from being electrically conductively connected to each other.

With respect to the first word select lines 300a disposed in the second region 420, k (e.g., k=8) first word select lines 300a are arrayed in the X-axis direction and j (e.g., j=2) first word select lines 300a are arrayed in the Z-axis direction. The first word select lines 300a are coupled to respective ones of the integrated word lines 150 over the second region 420 of the substrate.

With respect to the second word select lines 300b disposed in the third region 430, k (e.g., k=8) second word select lines 300b are arrayed in the X-axis direction and j (e.g., j=2) second word select lines 300b are arrayed in the Z-axis direction. The second word select lines 300b are coupled to respective ones of the integrated word lines 150 over the third region 430 of the substrate 100.

The first and second word select lines 300a and 300b are connected to the respective ones of the integrated word lines 150 by first connect contacts 250a and 250b. In this respect, the k (e.g., k=8) integrated word lines 150, of each set thereof distributed in the Z-axis direction, may be configured as stairs (with steps extending from the first region 410 towards each of the second and third regions 420 and 430) to facilitate their electrical connection to the first and second word select lines 300a and 300b. In this case, the first connect contacts 250a and 250b may be via plugs.

Figure 14:
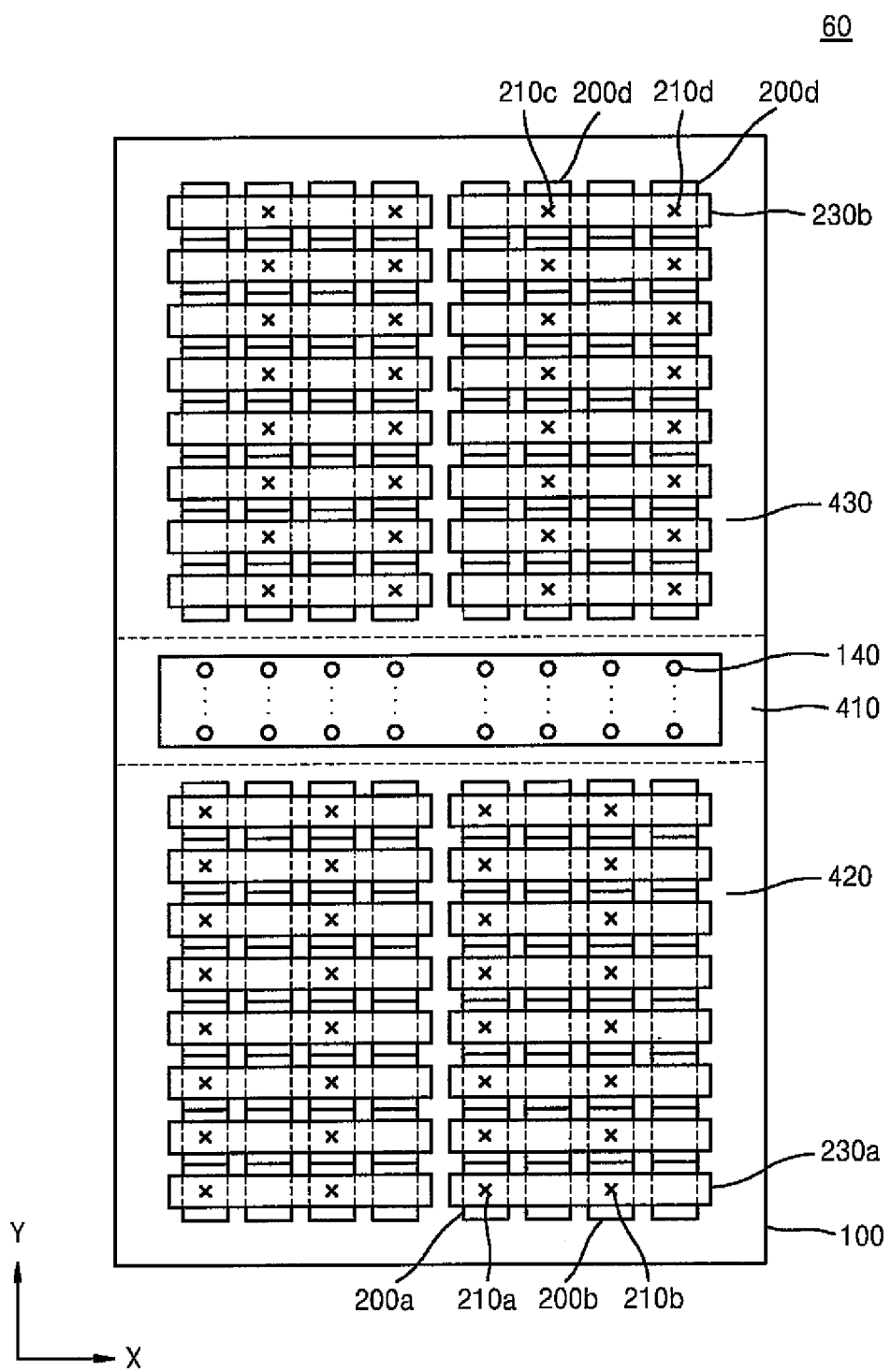
FIGS. 14 and 15 are schematic plan views of a vertical non-volatile memory device according to other embodiments of the inventive concept.
Figure 15:
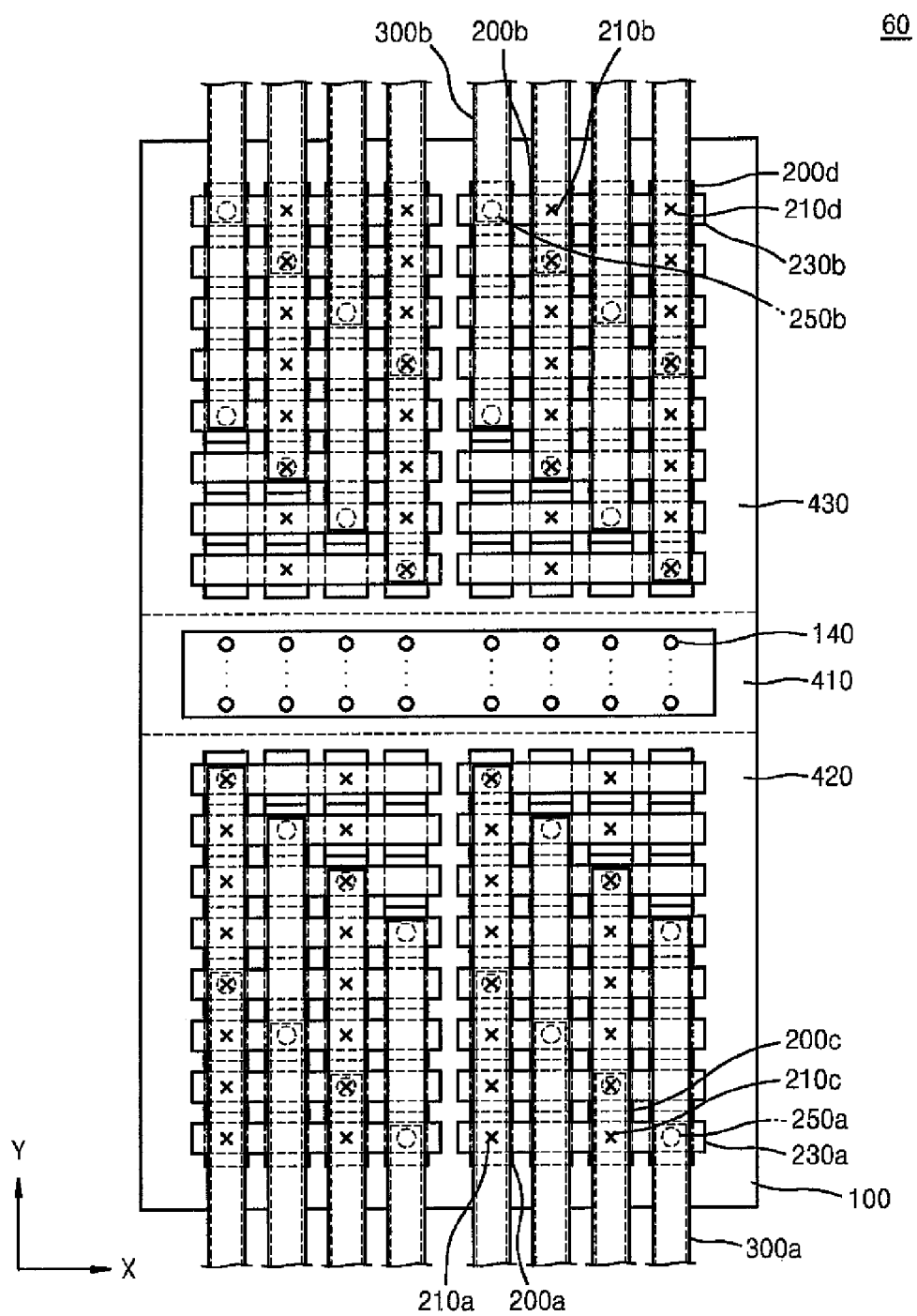

FIGS. 14 and 15 illustrate another embodiment of a vertical non-volatile memory device according to of the inventive concept. The vertical non-volatile memory device 60 is similar to the embodiment of the vertical non-volatile memory device 40 described with reference to FIGS. 11 and 12 except with respect to the pattern of connections between the array lines and the word lines, and between the word select lines and the array lines. Thus, the descriptions of the other features/aspects of the vertical non-volatile memory device 60 which are the same as those of the vertical non-volatile memory device 40 will not be repeated here.

Referring to FIGS. 14 and 15, each of the first array lines 230a disposed on the second region 420 is connected to a respective pair of the word lines that are nonadjacent in the X-axis direction, namely the word lines 200a and 200c. Likewise, each of the second array lines 230b disposed on the third region 430 is connected to a respective pair of the word lines that are nonadjacent in the X-axis direction, namely word lines 200b and 200d.

The first array lines 230a and the second array lines 230b and the respective word lines 200a and 200c or 200b and 200d are connected to each other via the second connect contacts 210a and 210c or 210b and 210d. The second connect contacts 210a and 210c or 210b and 210d may be via plugs, RDLs, or the like.

FIGS. 16A through 16G illustrate a method of fabricating a vertical non-volatile memory device according to the inventive concept.

Figure 16A:
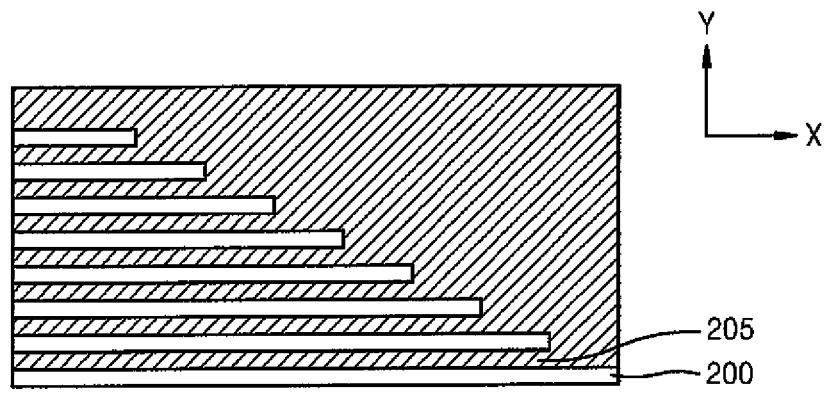
FIGS. 16A through 16G are cross-sectional views of intermediate memory device structures, and together illustrate an embodiment of a method of fabricating a vertical non-volatile memory device according to the inventive concept.

Referring to FIG. 16A, respective word lines 200 and interlayer insulation layers 205 are alternately formed one atop the other in the Z-axis direction on a substrate (not shown). The respective word lines 200 may be shorter and shorter so as to collectively have the form of stairs, and the interlayer insulation layers 205 are integrated so as to form a block of (electrical) interlayer insulation.

Figure 16B:
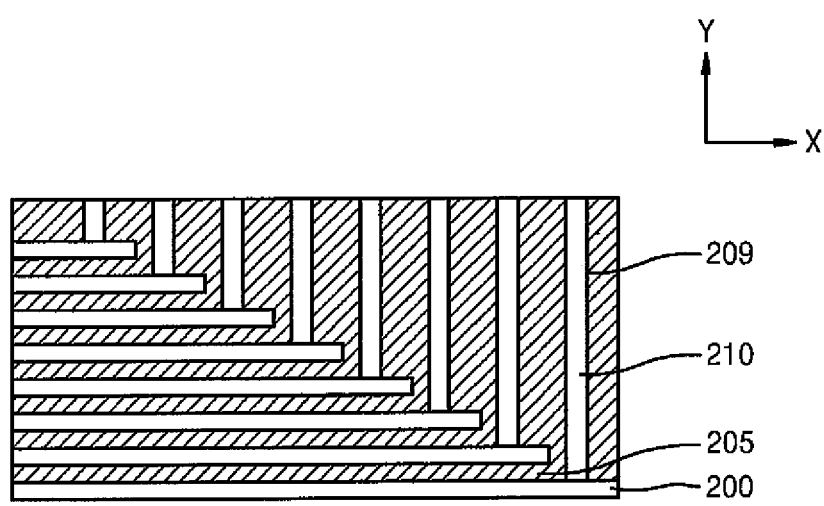

Referring to FIG. 16B, the interlayer insulation is patterned to form openings therein communicating with the word lines 200, respectively. The openings are filled to form second connect contacts 210 connected to the respective word lines 200, respectively. The forming of openings in a layer and the filling of the openings with conductive material is carried out by a "patterning" process that is well known, per se, in the art. For example, such a patterning process entails etching (the etching of a layer to form an opening), deposition (the deposition of material to fill the opening), and planarization (the planarizing of the resulting structure) processes.

Figure 16C:
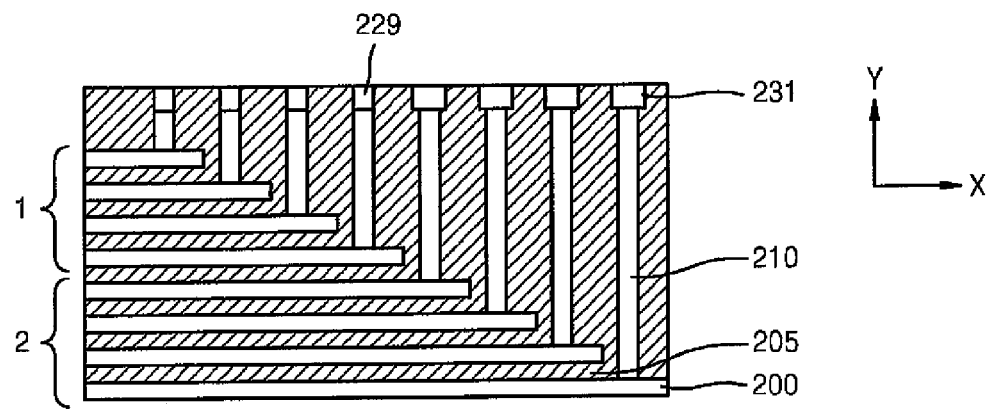

Referring to FIG. 16C, lower layer array lines 231 and first temporal connect contacts 229 are formed on upper portions of the second connect contacts 210, respectively, by a patterning process. As a result, lower layers 2 of the word lines 200 are connected to the lower layer array lines 231 through one set of the second connect contacts 210. Upper layers 1 of the word lines 200 are connected to the first temporal connect contacts 229 through another set of the second connect contacts 210.

Figure 16D:
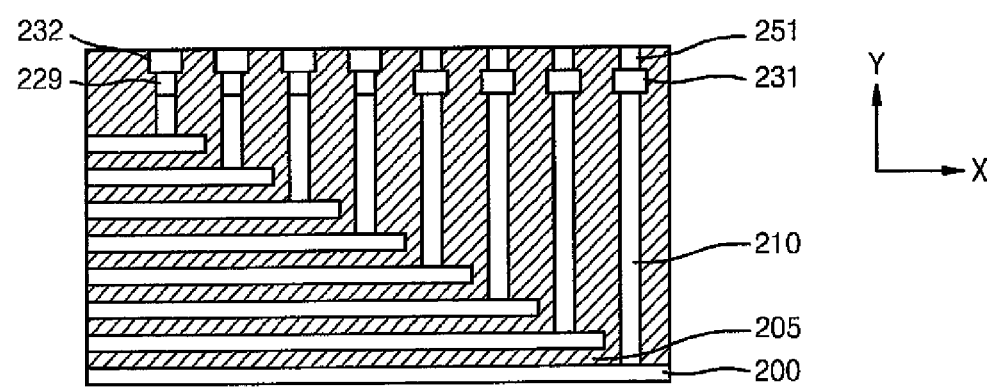

Referring to FIG. 16D, lower layer first connect contacts 251 are formed on the upper portions of the lower layer array lines 231 by a patterning process, and upper layer array lines 232 are formed on the upper portions of the first temporal connect contacts 229.

Figure 16E:
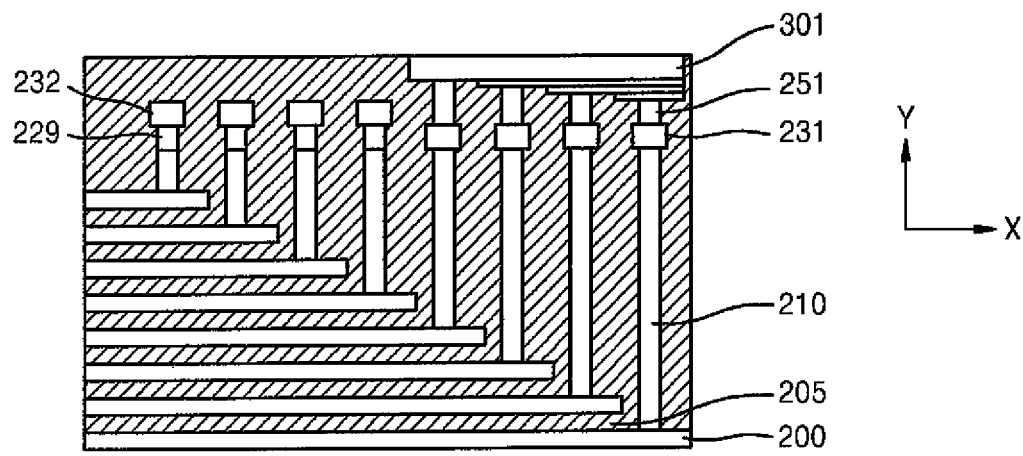

Referring to FIG. 16E, an additional interlayer insulation layer 205 is formed on the existing structure, and lower layer word select lines 301 are formed on the upper portions of the lower layer first connect contacts 251 by a patterning process. Note, the upper right hand portion of this figure is exaggerated slightly to show perspective and thereby illustrate the lower word select lines 301 which are formed substantially in the same interlayer insulation layer 205.

Figure 16F:
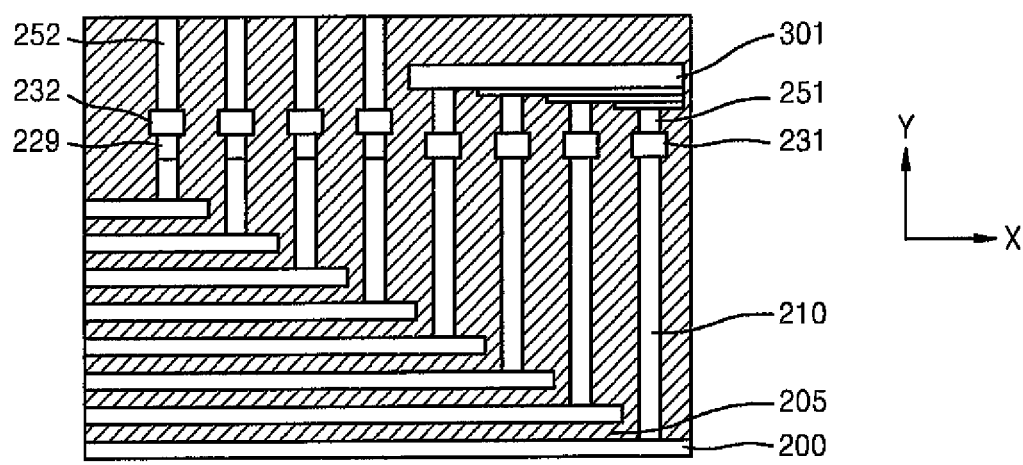

Referring to FIG. 16F, an additional interlayer insulation layer 205 is formed on the existing structure, and upper layer first connect contacts 252 are formed on upper portions of the upper layer array lines 232 by a patterning process.

Figure 16G:
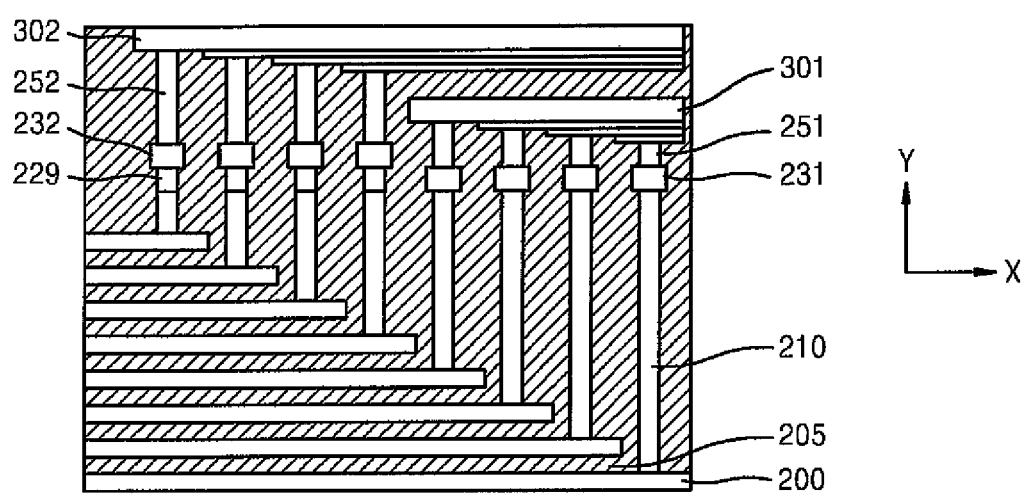

Referring to FIG. 16G, an additional interlayer insulation layer 205 is formed on the existing structure, and upper layer word select lines 302 are formed on upper portions of the upper layer first connect contacts 252 by a patterning process.

FIGS. 17A through 17D illustrate another embodiment of a method of fabricating a vertical non-volatile memory device according to the inventive concept. The method is similar to that described with reference to FIGS. 16A through 16G and thus, only the major differences between the methods will be described.

Figure 17A:
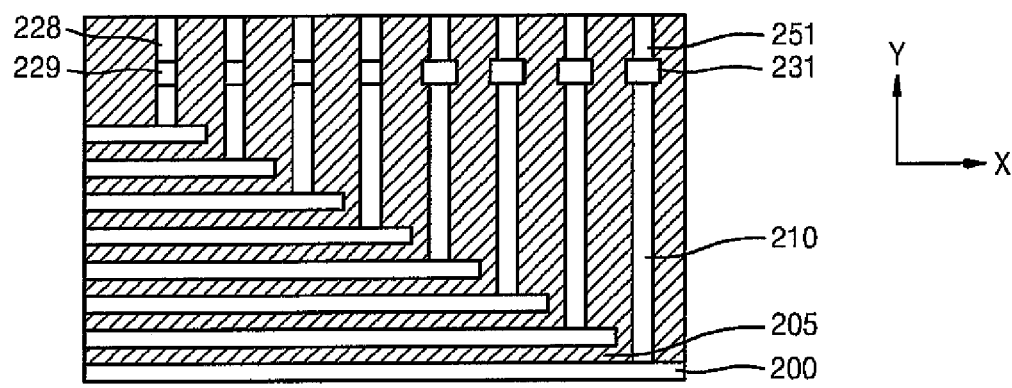
FIGS. 17A through 17D are cross-sectional views of intermediate memory device structures, and together illustrate another embodiment of a method of fabricating a vertical non-volatile memory device according to the inventive concept.

Referring to FIG. 17A, the method begins similarly to that shown in and described with reference to FIGS. 16A through 16C. Then, an additional interlayer insulation layer 205 is formed on the existing structure. Next, lower layer first connect contacts 251 are formed on upper portions of the lower layer array lines 231, and second temporal connect contacts 228 are formed on upper portions of the first temporal connect contacts 229, by a patterning process.

Figure 17B:
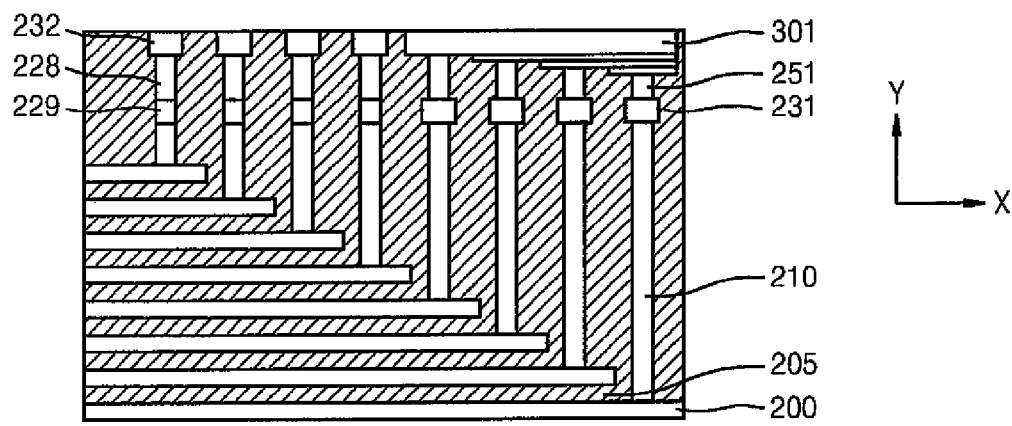

Referring to FIG. 17B, an additional interlayer insulation layer 205 is formed on the existing structure. Then, lower layer word select lines 301 are formed on upper portions of the lower layer first connect contacts 251, and upper layer array lines 232 are formed on the upper portions of the second temporal connect contacts 228, by a patterning process.

Figure 17C:
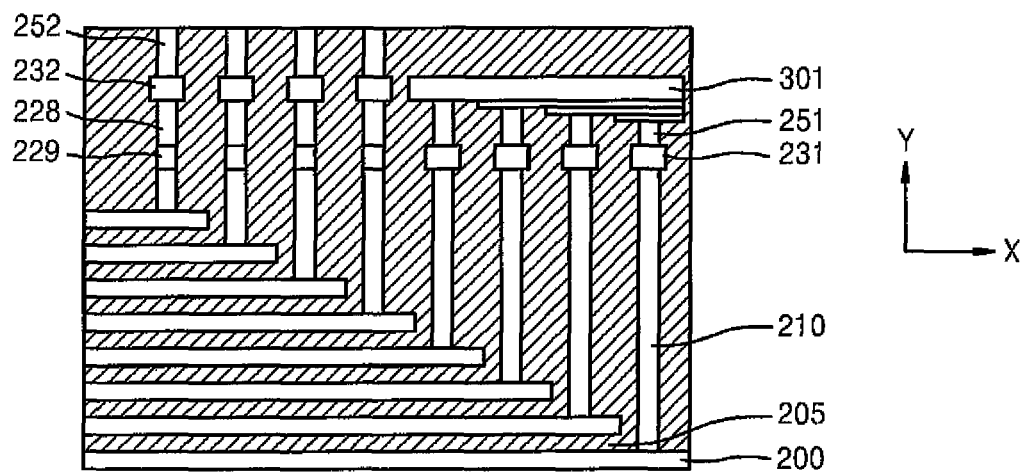

Referring to FIG. 17C, an additional interlayer insulation layer 205 is formed on the existing structure, and then upper layer first connect contacts 252 are formed on upper potions of the upper layer array lines 232 by a patterning process.

Figure 17D:
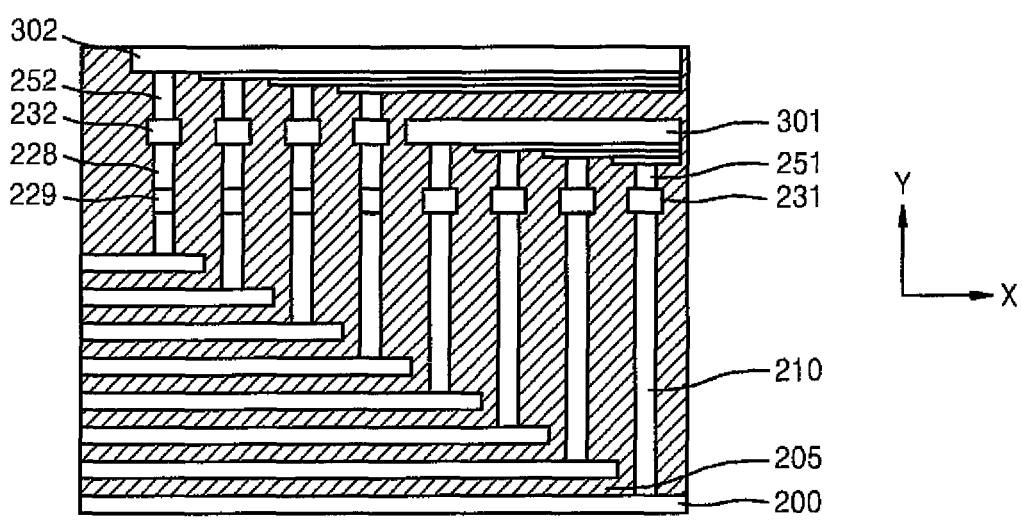

Referring to FIG. 17D, an additional interlayer insulation layer 205 is formed on the existing structure, and then upper layer word select lines 302 are formed on upper portions of the upper layer first connect contacts 252 by a patterning process.

In this embodiment, the upper layer array lines 232 are formed on the first and second temporal connect contacts 229 and 228. The first and second temporal connect contacts 229 and 228 provide more space between the upper layers 1 of the word lines 200 and the upper layer array lines 232. Accordingly, the upper layers 1 of the word lines 200 are prevented from being over-etched when the upper layer array lines 232 are formed (i.e., when the etching process used to form the upper layer array lines is carried out).

As described above, according to an aspect of the inventive concept there is provided a highly integrated vertical memory device which keeps the NOP to a minimum. Thus, a highly reliable vertical non-volatile memory device may be realized.

Finally, embodiments of the inventive concept have been described herein in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. A vertical non-volatile memory device comprising:
a substrate;
a first stack of word lines and a second stack of word lines extending in a first direction on the substrate, the first and the second stack separated from each other in a second direction perpendicular to the first direction;
first array lines extending in the second direction on the first and the second stack, each of the first array lines connected to word lines of the first and the second stack through at least two of first via contacts in a same level; and
first word select lines being in a same level and extending in the first direction, each of the first word select lines connected to each of the first array lines through at least one of second via contacts,
wherein ends of each of the first and the second stack have a form of stairs on the substrate.

2. The vertical non-volatile memory device of claim 1, further comprising;
a third stack of word lines on the first stack and a fourth stack of word lines on the second stack;
second array lines extending in the second direction on the third and the fourth stack, each of the second array lines connected to word lines of the third and the fourth stack through at least two of first via contacts in a same level; and
second word select lines being in a same level and extending in the first direction, each of the second word select lines connected to each of the second array lines through at least one of second via contacts,
wherein the first and the second word select lines are disposed higher than the first to the fourth stack, and the second word select lines are disposed higher than the first word select lines.

3. The vertical non-volatile memory device of claim 2, wherein the first and the second word select lines are overlapped in a direction perpendicular to a top surface of the substrate.

4. The vertical non-volatile memory device of claim 2, wherein the first and the second array lines are disposed in a same level.

5. The vertical non-volatile memory device of claim 2, wherein the second array lines are disposed higher than the first array lines.

6. The vertical non-volatile memory device of claim 2, wherein the second array lines and the first word select lines are disposed in a same level.

7. A vertical non-volatile memory device comprising:
a substrate;
a first to a fourth word line stacked in a first to a fourth levels on the substrate;
first word select lines being in a fifth level on the first and second word lines and connected to the first and the second word line, respectively; and
second word select lines being in a sixth level on the first to the fourth word lines and connected to the third and the fourth word line, respectively,
wherein the fifth and sixth level are higher than the first to the fourth levels and the sixth level is higher than the fifth level,
wherein ends of a stack of the first to the fourth word lines have a form of stairs on the substrate.

8. The vertical non-volatile memory device of claim 7, wherein the first and the second word select lines are overlapped in a direction perpendicular to a top surface of the substrate.

9. The vertical non-volatile memory device of claim 7, further comprising;
a fifth to a eighth word line, the fifth and the sixth word line stacked sequentially and interposed between the second word line and the third word line, and the seventh and the eighth word line stacked sequentially and disposed on the fourth word line,
third word select lines being in the fifth level and connected to the fifth and the sixth word line, respectively; and
fourth word select lines being in the sixth level and connected to the seventh and the eighth word line, respectively.

10. The vertical non-volatile memory device of claim 9, wherein the substrate having a first to a third region, first region is disposed between a second and a third region,
wherein the first to the eighth word line are extending in the first direction over the first through third region of the substrate and each is coupled to memory transistors in the first region,
wherein the first and the second word select lines are in the second region, and
wherein the third and the fourth word select lines are in the third region.

11. A vertical non-volatile memory device comprising:
a substrate having a first to a third region, the first region disposed between the second and the third region;
stacks of word lines extending in a first direction over the first through third region of the substrate, the stacks separated from each other in a second direction perpendicular to the first direction;
first array lines extending in the second direction on the stacks in the second region, each of the first array lines connected to word lines of a portion of the stacks through at least two of first connect contacts in a same level; and
second array lines extending in the second direction on the stacks in the third region, each of the second array lines connected to word lines of the rest of the stacks through at least two of first connect contacts in a same level,
wherein ends of each of the stacks have a form of stairs on the substrate.

12. The vertical non-volatile memory device of claim 11, wherein each of the word lines is coupled to memory transistors distributed in a direction perpendicular to a top surface of the substrate in the first region.

13. The vertical non-volatile memory device of claim 11, wherein the first and the second array lines are disposed in a same level.

14. The vertical non-volatile memory device of claim 11, further comprising;
first word select lines extending in the first direction in the second region, each of the first word select lines connected to each of the first array lines through at least one of second connect contacts, and
second word select lines extending in the first direction in the third region, each of the second word select lines connected to each of the second array lines through at least one of second connect contacts.

15. The vertical non-volatile memory device of claim 14, wherein the stacks comprise a first to a fourth stack, and the first to the fourth stack are separated from each other in the second direction sequentially,
wherein each of the first array lines is connected to word lines of the first stack and the third stack in a same level, and each of the second array lines is connected to word lines of the second stack and the fourth stack in the same level.

16. The vertical non-volatile memory device of claim 14, wherein the first word select lines comprise a stack of coplanar word select lines, and the second word select lines comprise a stack of coplanar word select lines.

* * * * *